United States Patent [19]
Sakaguchi et al.

[11] Patent Number: 5,763,288
[45] Date of Patent: Jun. 9, 1998

[54] METHOD FOR PRODUCING SEMICONDUCTOR SUBSTRATE BY WAFER BONDING

[75] Inventors: Kiyofumi Sakaguchi; Takao Yonehara, both of Atsugi, Japan

[73] Assignee: Canon Kabushiki Kaisha, Tokyo, Japan

[21] Appl. No.: 881,250

[22] Filed: Jun. 24, 1997

Related U.S. Application Data

[63] Continuation of Ser. No. 633,509, Apr. 17, 1996, abandoned, which is a continuation of Ser. No. 171,167, Dec. 22, 1993, abandoned.

[30] Foreign Application Priority Data

Dec. 25, 1992 [JP] Japan .................... 4-346729
Dec. 8, 1993 [JP] Japan .................... 5-308047

[51] Int. Cl.$^6$ ............................................ H01L 21/76
[52] U.S. Cl. ............................................ 438/455
[58] Field of Search ........................... 438/455, 222, 438/104, 105, 107, 425, 477; 148/DIG. 12

[56] References Cited

U.S. PATENT DOCUMENTS

| | | | |
|---|---|---|---|
| 5,250,460 | 10/1993 | Yamagata et al. | 437/62 |
| 5,258,322 | 11/1993 | Sakaguchi et al. | 437/62 |
| 5,266,135 | 11/1993 | Short et al. | 156/87 |
| 5,334,273 | 8/1994 | Short et al. | 156/87 |

OTHER PUBLICATIONS

Stevie, F.A. et al., "Boron contamination of surfaces in silicon microelectronics processing: Characterization and causes," Journal of Vacuum Science & Tech. A, vol. 9, No. 5, pp. 2813–16 (1991).

"Single–Crystal Silicon on Non–Single–Crystal Insulators," edited by G.W. Cullen, Journal of Crystal Growth, vol. 63, No. 3, pp. 429–590 (1983).

Haisma et al., JAP. J. APPL. PHYS., vol. 28, No. 8 (1989) pp. 1426–1443.

*Primary Examiner*—George R. Fourson
*Attorney, Agent, or Firm*—Fitzpatrick, Cella, Harper & Scinto

[57] ABSTRACT

A semiconductor substrate is produced by bonding a pair of substrate materials together, at least one of which comprises a semiconductor substrate material with or without an insulating layer on a surface thereof. The production includes treating the substrate materials with a suitable liquid such that the pair of substrate materials are immersed in the liquid, the substrate materials are superimposed on each other in the liquid, the substrate materials in their superimposed position are lifted from the liquid, and a portion of the liquid captured between the substrate materials is removed so as to bond the substrate materials together.

40 Claims, 9 Drawing Sheets

4A — — 4A'

↓ 1000 C 2hrs.

↓ GRINDING

↓ ETCHING
  (HF HNO3 CH3COOH)

↓ ETCHING
  (BUFFERED HF)

METHOD FOR PRODUCING SEMICONDUCTOR SUBSTRATE BY WAFER BONDING

This application is a continuation of application Ser. No. 08/633,509 filed Apr. 17, 1996, now abandoned, which is a continuation of application Ser. No. 08/171,167 filed Dec. 22, 1993, now abandoned.

BACKGROUND OF THE INVENTION

1. Field of the Invention

The present invention relates to a method for producing a semiconductor substrate by using a bonding process, and a semiconductor substrate produced by such a method. Particularly, the present invention relates to a method for producing a bonded semiconductor substrate suitable for fabricating an electronic device or an integrated circuit on or in a single-crystal semiconductor layer which is in turn formed on a dielectric separation or an insulator, and to a semiconductor substrate produced by such a method.

2. Related Background Art

Formation of a single-crystal silicon (Si) semiconductor layer on an insulator is widely known as silicon on insulator (SOI) technology. Various research has been made on SOI technology because devices fabricated by utilizing SOI technology have many advantages over devices fabricated by using bulk Si substrates which are normally used to fabricate Si integrated circuits. Utilizing SOI technology provides advantages such as the following:

1. Dielectric separation is readily provided, enabling high levels of integration;

2. Radiation resistance is excellent;

3. Stray capacity is reduced, enabling high-speed operation;

4. The well process can be omitted;

5. A latch-up phenomenon can be prevented; and

6. Thin-film formation enables the fabrication of a complete depletion type field-effect transistor.

In order to realize such numerous advantages, some of which relate to the characteristics of the devices, methods for forming SOI structures have been the subject of research for the past several decades. Some of the studies are shown in the following document: "Special Issue: Single-crystal Silicon on Non-single-crystal Insulators" (edited by G. W. Cullen, Journal of Crystal Growth, Volume 63, No. 3, pages 429 to 590, 1983).

Besides such conventional SOI structure forming methods, another method for forming SOI structures has been of much interest in recent years. In this type of method, a Si single-crystal substrate is bonded to another Si single-crystal substrate, which has been subjected to thermal oxidation, either by heat treatment or with an adhesive, so as to form an SOI structure. In this method, since a substantially completely single-crystal Si wafer can be used as a material for forming one of the Si layers, a large number of researchers have been engaged in researches concerning the method.

It has been found recently that boron (B) particles contained in air in a clean room tend to adhere to the surfaces of wafers ("J. Vac. Sci. Technol"; A9, 2813, 1991, by F. A. Stevie et al.). It is also known that when wafers are bonded together as above in a boron-containing atmosphere of a clean room, boron particles are confined in the bonding interface (I/F), and diffuse from the interface into the bonded wafers during heat treatment ("Report of Institute of Electronics and Communication Engineers of Japan"; SDM91-195, 15, 1992, by Yoshimi Ohki, et al.).

The source of such boron particles is the boron silicate glass of a high efficiency particulate air filter (HEPA) used in the clean room. Thus, adhesion of boron particles is inevitable. In order to remove boron particles, it is necessary to bake wafers to be bonded at a high temperature in the presence of $H_2$, rinse them with hydrogen fluoride (HF) or the like, or thermally oxidize the relevant surfaces of the wafers. However, once the resulting wafers are placed in a clean room atmosphere, boron particles again adhere, thereby substantially cancelling the effect of removal.

It is known that such particles on the bonded surfaces of wafers create voids, which cause vacancies and non-contact portions in a SOI layer. Thus, particle adhesion is one of the major problems which SOI structure forming by bonding has to overcome.

Boron particles confined in the bonding interface diffuse into the SOI layer. This makes it difficult to properly control the dosage of the doped Si layers, thereby involving the risk that the threshold voltage may not be properly controlled. Also, in the case of bonded oxide films, a large amount of boron particles may be similarly confined in the oxide films. Since such boron particles may create a fixed charge in $SiO_2$, they present a serious problem to the formation of SOI large scale integrations (SOILSIs). Even when Si layers are directly bonded together in a silicon on silicon manner rather than in a silicon on insulator manner, confined boron particles may make it impossible to properly control the concentration of impurities in the vicinity of the interface.

Thus, it is essential to perform bonding in such a manner as to prevent boron particles from adhering to the surfaces to be bonded.

Certain technological matters concerning silicon bonding technology are disclosed in "Abstract No. 487 (page 724 to 725)" on the Bonding Symposium held by Electro-Chemical Society from 13th to 18th of Oct. 1991. FIG. 1 of the Abstract shows a jig for silicon bonding, and the 724th page of the document contains the following statement: "The wafer surfaces can then be scrubbed, cleaned and washed in a variety of super clean liquid ambients. Without touching their surfaces, the wafers are then brought together while immersed in the liquid environment thus eliminating the necessity for high specification clean room conditions".

However, the Abstract gives no consideration to adverse effects of boron particles in the interface between bonded substrate materials, nor does it disclose bonding a pair of substrate materials by immersing the substrate materials in a suitable liquid, superimposing the substrate materials on each other in the liquid, lifting the substrate materials in their superimposed position from the liquid, and removing a portion of the liquid captured between the substrate materials, so as to bond the substrate materials together.

SUMMARY OF THE INVENTION

A primary object of the present invention is to provide a method for producing a semiconductor substrate that is capable of overcoming the above-described problems.

Another object of the present invention is to provide a method for producing a semiconductor substrate that is capable of preventing or reducing to a very low level the risk that particles of boron, etc. may be confined in the bonding interface between substrate materials.

A further object of the present invention is to provide a method for producing a semiconductor substrate by bonding a pair of substrate materials together, at least one of the substrate materials comprising either a semiconductor substrate material or a semiconductor substrate material having an insulating layer on a surface thereof. The method comprises the steps of: immersing the pair of substrate materials in a liquid; superimposing the substrate materials on each other in the liquid; lifting the substrate materials in a superimposed position thereof from the liquid; and removing a portion of the liquid captured between the substrate materials so as to bond the substrate materials together.

DETAILED DESCRIPTION OF THE INVENTION AND PREFERRED EMBODIMENTS

Figure 1A:
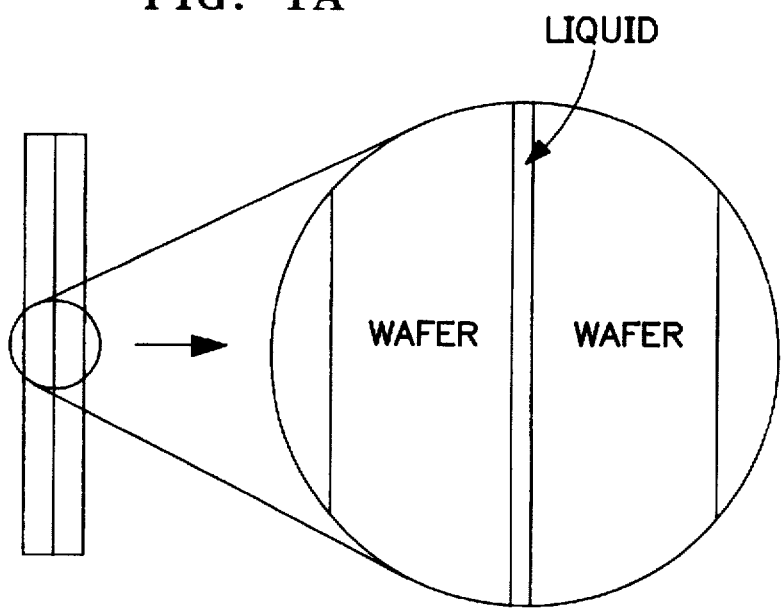
FIGS. 1A and 1B schematically depict an example of a process of a semiconductor substrate production method according to the present invention.

The present invention provides a method for producing a semiconductor substrate by bonding a pair of substrate materials together, at least one of the substrate materials comprising either a semiconductor substrate material or a semiconductor substrate material having an insulating layer on a surface thereof, the method being characterized in that it includes treating the substrate materials with a liquid, wherein the pair of substrate materials are immersed in the liquid, the substrate materials are superimposed on each other in the liquid, the substrate materials in a superimposed position thereof are lifted from the liquid, and a portion of the liquid captured between the substrate materials is removed so as to bond the substrate materials together.

The present invention also provides a semiconductor substrate produced by such a method.

According to the method of the present invention, those surfaces of a pair of substrate materials on which they are to be bonded to each other (i.e., the major surfaces of the substrate materials) are not exposed to ambient air containing boron particles, so that the substrate materials can be bonded together with substantially no boron particles adhering to the bonding interface. This makes it possible for a semiconductor substrate to be produced by a bonding process such that the substrate has a controlled concentration of impurities.

When the superimposed substrate materials which have been lifted from a liquid, such as an extra pure water, are heated or introduced into a vacuum, it is possible to efficiently remove a portion of the liquid captured in a very narrow gap between the superimposed substrate materials without introducing air from a clean room atmosphere. Heating the substrate materials causes a captured liquid portion to evaporate, diffusing outwardly on the interface of superimposition. Thus, air in the clean room atmosphere is prevented from being introduced into the bonding interface, thereby enabling advantageous bonding. Introducing the substrate materials into a vacuum causes a captured liquid portion to be drawn out from the interface between the superimposed substrate materials, thereby enabling removal and bonding to be performed without exposing the substrate materials to air.

As described in the preceding section, when boron particles adsorbed to each substrate material are removed by baking the substrate material in the presence of $H_2$, washing it with HF, or thermally oxidizing the major surface of the substrate material, boron particles again adhere when the resulting substrate materials are placed in a clean room atmosphere. In order to substantially completely prevent boron adhesion, the following method may be adopted: after substrate materials are washed in an HF solution, the HF solution is replaced with an extra pure water or the like, in which the substrate materials are to be brought together, while the substrate materials remain in the HF solution. In practice, the substrate materials which have been washed in a HF solution, are taken out of the solution before they are subjected to the subsequent washing step a few seconds later, with the result that the substrate materials are exposed to ambient air to some extent. It has been confirmed, from the results of experiments conducted by the present inventors, that the above method is capable of reducing re-adhesion of boron particles to a level that does not cause problems in practice.

Figure 5A:
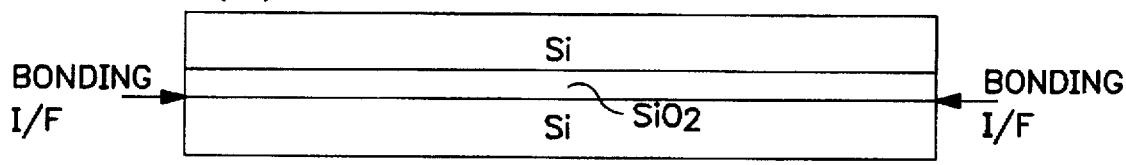
FIGS. 5(A) to 5(E) schematically depict processes empirically performed to check the effectiveness of the present invention.
Figure 5B:
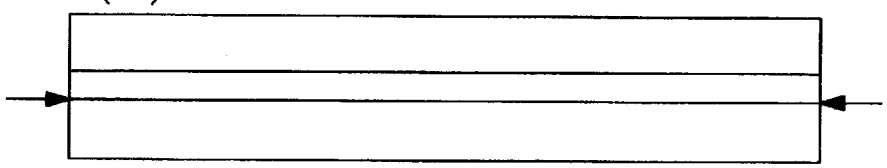
Figure 5C:
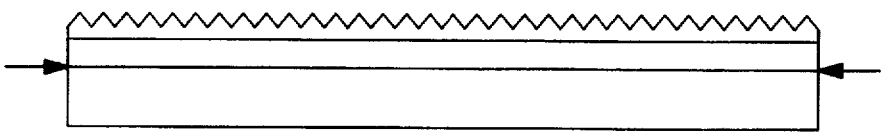
Figure 5D:
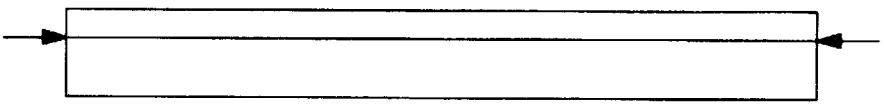
Figure 5E:

In the experiments, first and second sample substrates were produced by processes shown in FIGS. 5(A) to 5(E). Each pair of substrate materials, comprising a Si substrate material and a Si substrate material having a $SiO_2$ film thereon, were bonded together, thereby obtaining a structure shown in FIG. 5(A). Boron particles confined in the bonding interface of the bonded structure were diffused into the Si layers by heat treating the structure at 1000° C. for 2 hours (FIG. 5(B)). Then, the substrate material having the oxide film was removed by grinding and etching, as shown in FIGS. 5(C) and 5(D), thereby obtaining a substrate such as that shown in FIG. 5(E). The boron concentration in each sample was evaluated as SIMS data, and plotted against the distance from the surface of the substrate.

Figure 6:
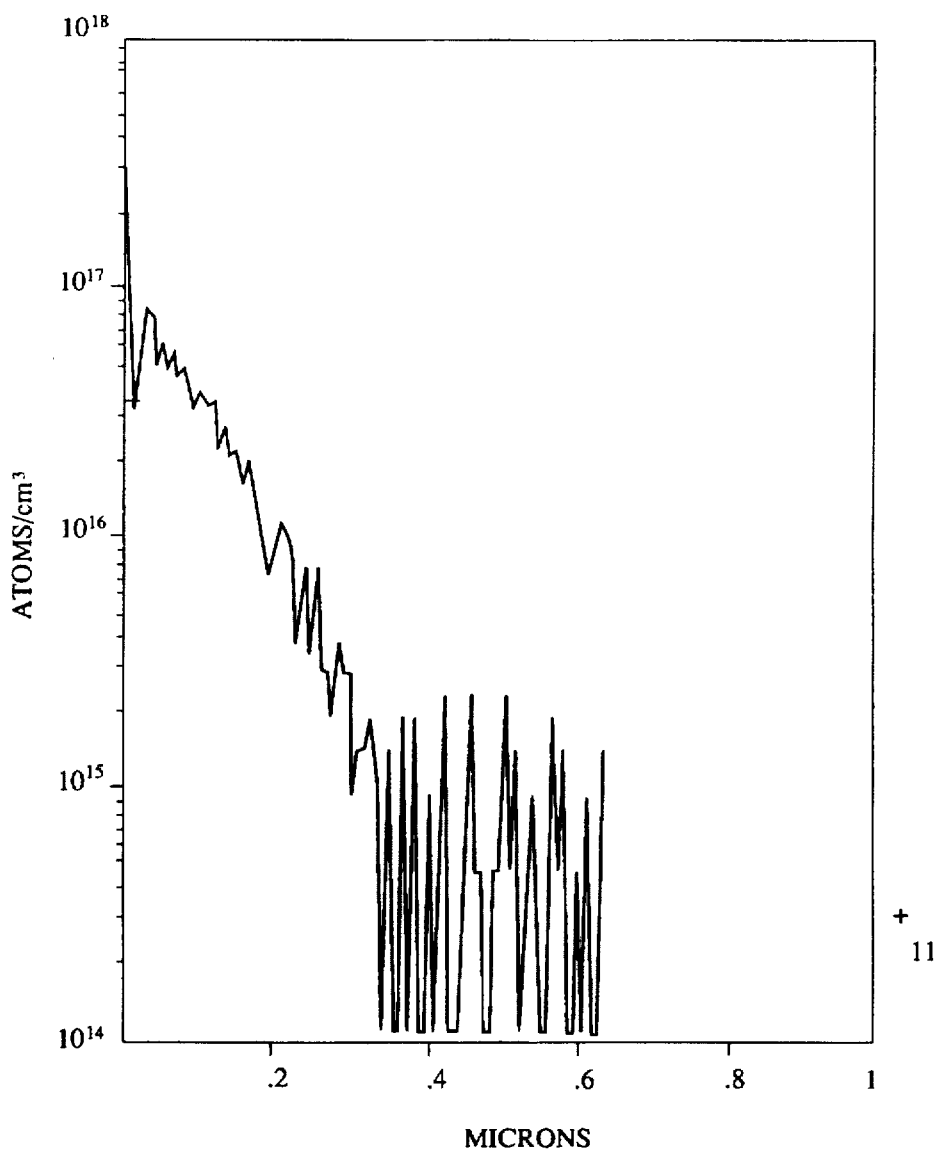
FIG. 6 is a graph showing the relationship between the boron concentration and the distance from the surface of a sample substrate obtained by a conventional bonding process.

The first sample was produced by performing bonding in air in a clean room atmosphere. FIG. 6 shows the boron concentration in the first sample. It is seen from FIG. 6 that portions close to the surface of the first sample contain substantial amounts of boron particles.

Figure 7:
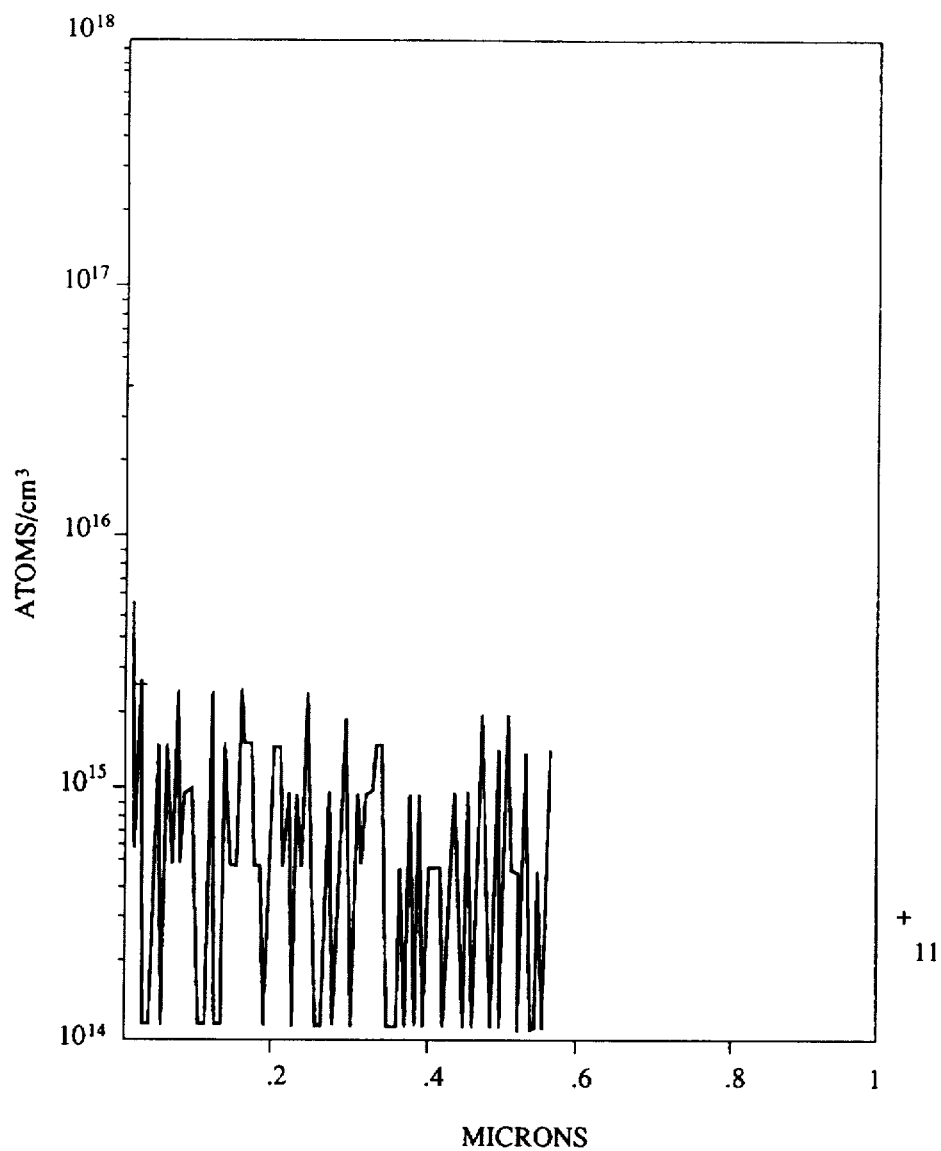
FIG. 7 is a graph showing the relationship between the boron concentration and the distance from the surface of a sample substrate obtained by a bonding process of the present invention.

On the other hand, the second sample was produced in such a manner that, after the substrate materials were washed in a HF solution, the substrate materials were transferred to a water, and brought together in the water. FIG. 7 shows the boron concentration in the second sample evaluated in a similar way.

As shown in FIG. 7, the boron concentration in the second sample is below the level corresponding to the sensitivity limit of SIMS detection. Thus, it has been found that even when substrate materials are exposed to ambient air to some extent during their transfer from a washing step to another washing step, the amount of boron particles adsorbed to the surfaces of the substrate materials is substantially negligible, and is low enough to make the substrate materials usable for the fabrication of SOI devices.

In a semiconductor substrate production method according to the present invention, when the portion of a liquid captured in the gap between the superimposed substrate materials is being removed, the captured liquid portion flows outwardly through the very narrow inter-substrate gap to be ejected to the outside of the gap, as shown in FIGS. 2A–2D, thereby purging particles which have been captured in the gap since the superimposition of the substrate materials.

When removing a captured liquid portion comprises heating the substrate materials, this provides in addition to the above effect, the effect of heating the substrate materials themselves, with the result that molecules adsorbed on the surfaces of the substrate materials to be bonded can be controlled.

According to the present invention, the above treatment of the substrate materials with the liquid may be combined with a pre-treatment of the substrate materials in which a hydrophobic property is imparted to the surfaces of the substrate materials, and a post-treatment in which the liquid-treated substrate materials are pressurized. This arrangement makes it possible to reduce adsorption of water onto the surfaces to be bonded, and accordingly, to eliminate water vapor considered to be capable of generating voids. The hydrophobic property treatment decreases the property to be bonded easily. However, this reduction can be sufficiently compensated for by the pressurizing treatment.

When the liquid with which the substrate materials are treated comprises a liquid having a low boiling point, a captured liquid portion can be removed even when the removal is effected at a low temperature. If removal is still effected a high temperature, it is possible to remove particles by virtue of high-pressure ejection of the liquid.

Figure 8:
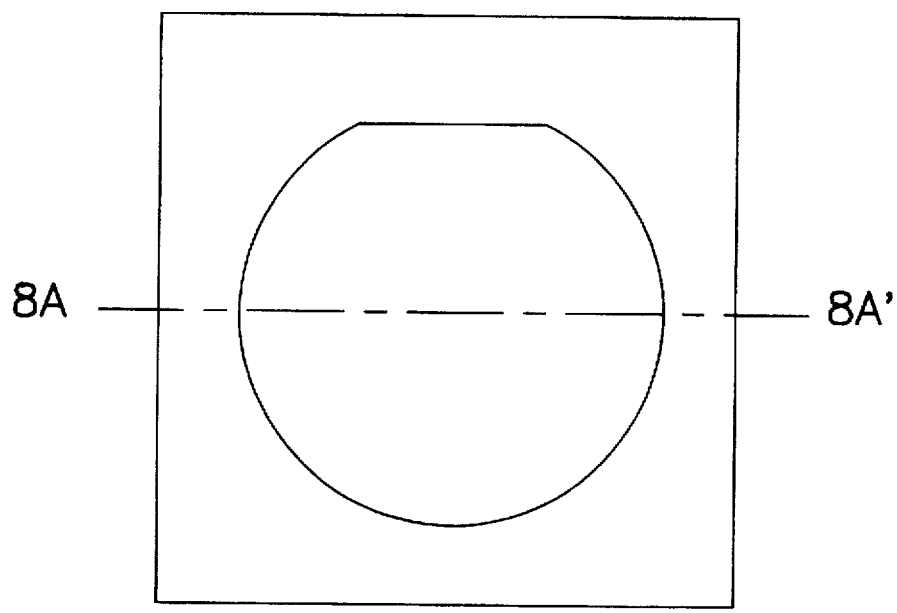
FIGS. 8 and 8A depicts an example of a wafer guide which may be used in a method according to the present invention.
Figure 8A:
Figure 9:
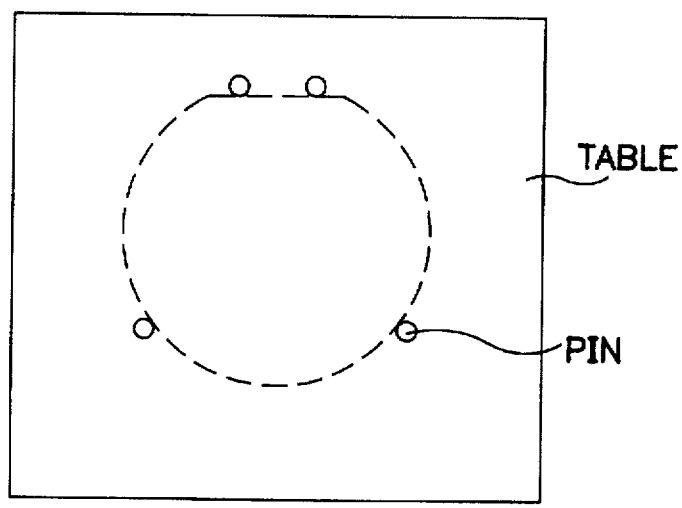
FIGS. 9 and 9A depict an example of another wafer guide which may be used in a method according to the present invention.
Figure 9A:
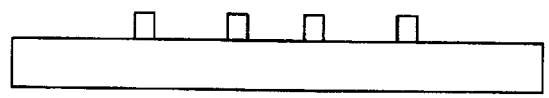

When the substrate materials are retained in a jig having a guide, or subjected to a load, or subjected to a load while retained in the jig during the removal of a captured liquid portion, it is possible to prevent displacement of the substrate materials. The guide may be one known as a "wafer guide", such as a counterbore, shown in FIGS. 8 and 8A), having a shape matching that of the substrate materials, or pins, shown in FIGS. 9 and 9A), projecting from the surface of a table for contacting the outer periphery of the substrate materials. The position and the number of pins are not limited to those shown in FIGS. 9 and 9A) so long as the pins are arranged to prevent displacement of the substrate materials.

Figure 3:
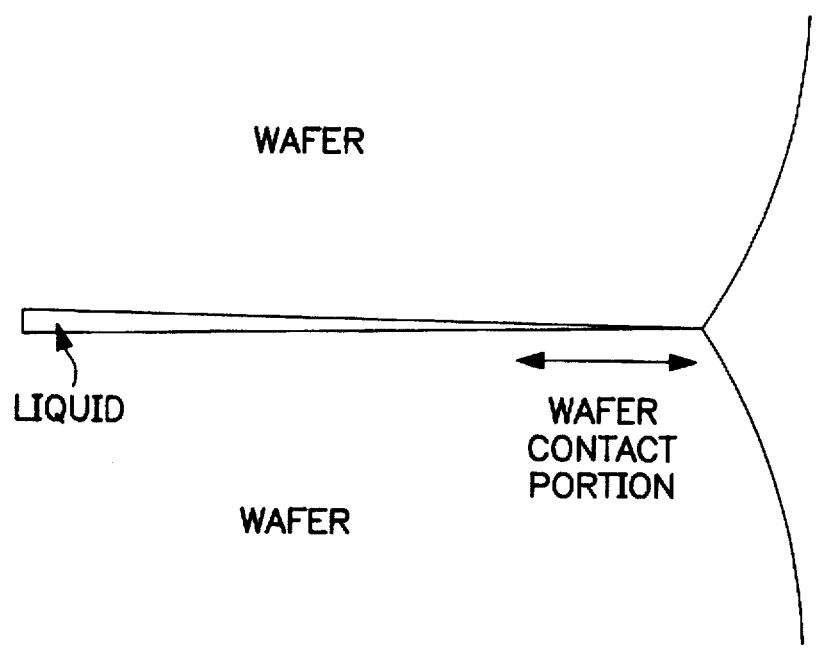
FIG. 3 schematically depicts an example of still another process of the method according to the present invention.
Figure 4:
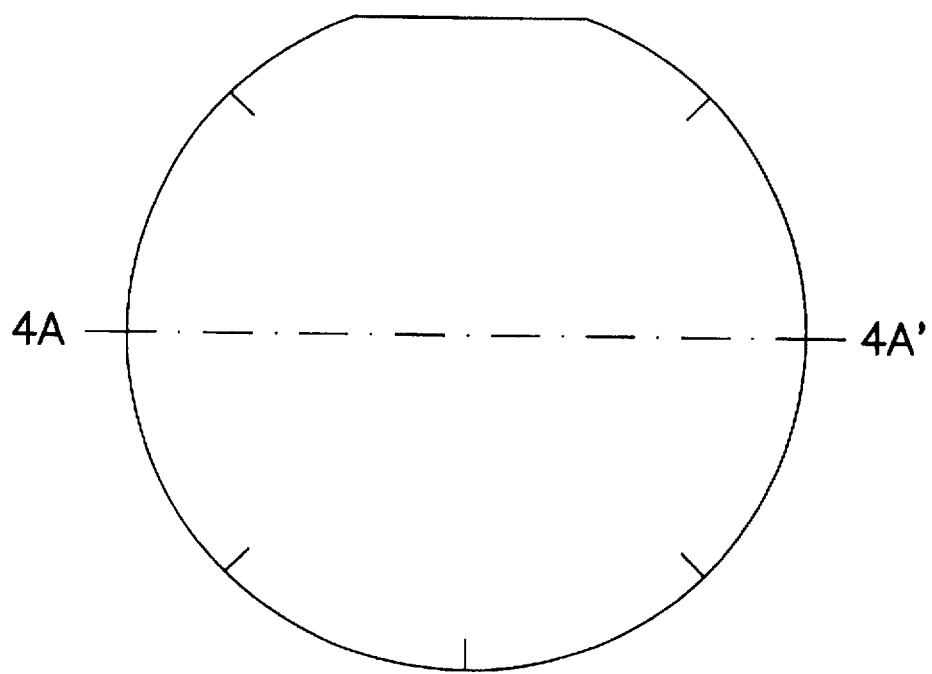
FIGS. 4 and 4A schematically depicts grooves formed in a peripheral portion of a semiconductor substrate material.
Figure 4A:

Removal of a captured liquid portion will be described in detail with reference to FIG. 3. When substrate materials which have been superimposed on each other in an extra pure water, etc., and lifted therefrom, are allowed to stand for a short period in ambient air or start to be heated, only the peripheral portions of the superimposed substrate materials are brought into contact with each other, as shown in FIG. 3. This region of the substrate materials undergoes a van der Waals bonding with a van der Waals force, thereby completely sealing a captured liquid portion within that region. When the substrate materials in this state are heated, the captured liquid portion evaporates. When the internal pressure within the sealing region increases above a certain value, the liquid portion breaks the seal by the van der Waals bonding, and rapidly evaporates to the outside of the substrate materials, whereby the liquid portion is removed. When the van der Waals force is very strong, or when the substrate materials have high rigidity, the internal pressure must increase to a considerably high value before the liquid portion can be removed. As a result, when the liquid portion is removed at last, the removal occurs like an explosion. At this time, there is a risk that the substrate materials may be broken. In view of this risk, at least one of substrate materials to be used may have one or more liquid escape grooves formed, as shown in FIGS. 4 and 4A, in a peripheral portion of the surface of the substrate material to be bonded along radial vectors on the surface, so that a liquid portion can be readily removed even when the bonding involves a strong force or highly rigid substrate materials.

In a semiconductor substrate production method according to the present invention, a liquid in which a pair of substrate materials are immersed preferably has a temperature within a range of from 10° to 80° C., more preferably from 20° to 40° C., from the viewpoint of operability and washing efficiency. As described above, the removal of a liquid portion captured in the gap between a pair of superimposed substrate materials lifted from the liquid can be efficiently performed by introducing the superimposed substrate materials into a vacuum chamber or heating the superimposed substrate materials. The superimposed substrate materials may be heated to a temperature of from 50° to 400° C., preferably, from 70° to 200° C.

First Embodiment

Figure 1B:
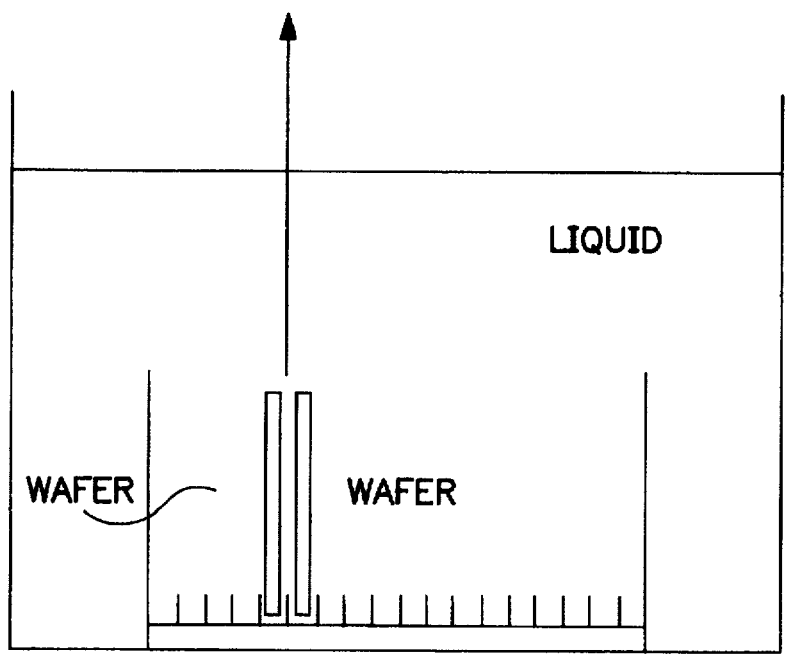
Figure 2A:
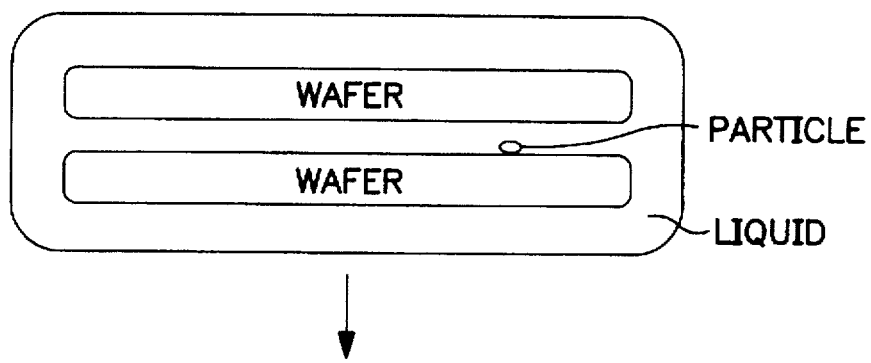
FIGS. 2A–2D schematically depict an example of another process of the method according to the present invention.
Figure 2B:
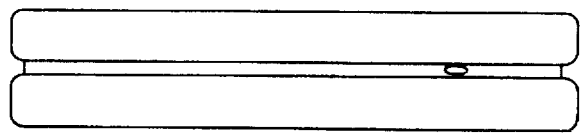
Figure 2C:
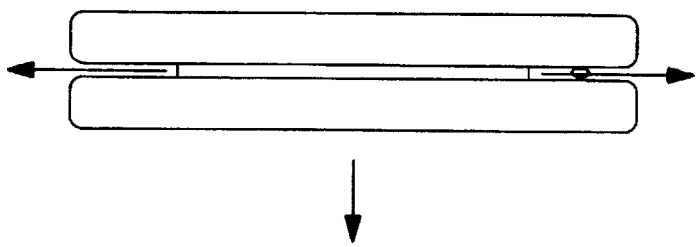
Figure 2D:
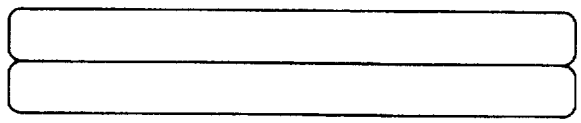

A pair of substrate materials, which have been subjected to a normal surface boron particle removal process for removing boron particles adsorbed on the surfaces thereof, are prepared, the pair of substrate materials comprising one of the following types of combinations (i) to (ix): (i) a semiconductor substrate material and another semiconductor substrate material; (ii) a semiconductor substrate material and another semiconductor substrate material having an oxide film; (iii) a semiconductor substrate material having an oxide film and another semiconductor substrate material having an oxide film; (iv) a semiconductor epitaxial substrate material and a semiconductor substrate material having an oxide film; (v) a semiconductor epitaxial substrate material having an oxide film and a semiconductor substrate material having an oxide film; (vi) a semiconductor substrate material and a light-transmitting substrate material; (vii) a semiconductor substrate material having an oxide film and a light-transmitting substrate material, (viii) a semiconductor epitaxial substrate material and a light-transmitting substrate material; and (ix) a semiconductor epitaxial substrate material having an oxide film and a light-transmitting substrate material. The prepared substrate materials are immersed into a suitable liquid without exposing the substrate materials to air in the clean room atmosphere except for air surrounding the cleaning line. Then, the substrate materials are superimposed on each other in the liquid, and lifted from the liquid in a superimposed position of the substrate materials (see FIG. 1, in which a portion of the superimposed and lifted substrate materials is depicted on an enlarged scale in a circle on the right side). Thereafter, a portion of the liquid captured in the gap between the superimposed substrate materials is removed by heating the substrate materials. When the captured liquid portion is being removed, the substrate materials may be retained by a guide, such as that shown in FIGS. 8 and 8A or FIGS. 9 and 9A, or be loaded, so that the substrate materials are not displaced. For this purpose, the substrate materials may, of course, be loaded while retained by a guide.

Second Embodiment

A pair of substrate materials, which have been subjected to a normal surface boron removal process, are prepared, the pair of substrate materials comprising one of the above-listed types of combinations (i) to (ix). The prepared substrate materials are immersed in a suitable liquid without being exposed to air in the clean room atmosphere except for air surrounding the cleaning line, superimposed on each other in the liquid, and lifted from the liquid in their superimposed position (see FIGS. 1A and 1B). Thereafter, a captured liquid portion between the superimposed substrate materials is removed by introducing the substrate materials into a vacuum. The removal may be performed while the substrate materials are retained by a guide such as that shown in FIGS. 8 and 8A or FIGS. 9 and 9A, or loaded, or loaded while retained by a guide, so as to prevent displacement of the substrate materials.

Third Embodiment

A pair of substrate materials are prepared; at least one of the substrate materials has one or more liquid escape grooves, such as those shown in FIGS. 4 and 4A, formed in a peripheral portion of the surface of the substrate material on which it is to be bonded, and extending along radial vectors on that surface, and the substrate materials have been subjected to a normal surface boron removal process. The pair of substrate materials comprises one of the above-listed types of combinations (i) to (ix). The prepared substrate materials are immersed in a suitable liquid without being exposed to air in the clean room atmosphere except for air surrounding the cleaning line, superimposed on each other in the liquid, and lifted from the liquid in their superimposed position (see FIGS. 1A and 1B). Thereafter, a captured liquid portion between the superimposed substrate materials is removed by heating the substrate materials. The removal may be performed while the substrate materials are retained by a guide such as that shown in FIG. 8 or FIG. 9, or loaded, or loaded while retained by a guide, so as to prevent displacement of the substrate materials.

The liquid escape groove or grooves on one or both of the substrate materials are formed by a technique such as lithography, laser working, energy beam working, or scoring with a diamond pen.

Fourth Embodiment

A pair of substrate materials are prepared; at least one of the substrate materials has one or more liquid escape grooves, such as those shown in FIGS. 4 and 4A, formed in a peripheral portion of the surface of the substrate material on which it is to be bonded, and extending along radial vectors on that surface, and the substrate materials have been subjected to a normal surface boron removal process. The pair of substrate materials comprises one of the above-listed types of combinations (i) to (ix). The prepared substrate materials are immersed in a suitable liquid without being exposed to air in the clean room atmosphere except for air surrounding the cleaning line, superimposed on each other in the liquid, and lifted from the liquid in their superimposed position (see FIGS. 1 and 1B). Thereafter, a captured liquid portion between the superimposed substrate materials is removed by introducing the substrate materials into a vacuum. The removal may be performed while the substrate materials are retained by a guide such as that shown in FIGS. 8 and 8A or FIGS. 9 and 9A, or loaded, or loaded while retained by a guide, so as to prevent displacement of the substrate materials.

The liquid escape groove or grooves on one or both of the substrate materials are formed by a technique such as lithography, laser working, energy beam working, or scoring with a diamond pen.

The present invention will now be described by specific examples thereof. However, the present invention is not intended to be limited by these examples.

EXAMPLE 1

A 5-inch Si wafer and another 5-inch Si wafer having a 0.5 μm-thick oxide film formed thereon were subjected to a normal pre-bonding washing process, thereby preparing a pair of substrate materials. Thereafter, the wafers were subjected to a water washing process immediately before a wafer drying process. In this washing process, the two wafers were superimposed on each other in an extra pure water with the mirorr-finished surfaces of the wafers opposed to each other. Then, the wafers were lifted from the water in their superimposed position. Subsequently, the superimposed wafers were heated to a temperature of 120° C., thereby evaporating a portion of the water captured between the wafers, with the result that the captured water portion was removed and the substrate materials were closely contacted each other. After the removal, the resulting wafers were observed by using an infrared (IR) microscope, an ultrasonic microscope, X-ray topography or a like means, as in a normal bonding process. As a result, no contact-failure portion that had failed to contact was observed in the bonding interface. When the boron concentration in the vicinity of the bonding interface was evaluated, no excessive boron concentration above the level originally contained in the substrate materials, was detected.

Results similar to the above results were obtained when wafers comprising each of the following different types of combinations of substrate materials (1) to (4) were used: (1) a Si substrate material and another Si substrate material; (2) a Si substrate material having an oxide film and another Si substrate material having an oxide film; (3) a Si substrate material and a light-transmitting substrate material; and (4) a Si substrate material having an oxide film and a light-transmitting substrate material.

EXAMPLE 2

A 5-inch Si wafer and another 5-inch Si wafer having a 0.5 μm-thick oxide film formed thereon were subjected to a normal pre-bonding washing process, thereby preparing a pair of substrate materials. Thereafter, the wafers were subjected to a water washing process immediately before a wafer drying process. In this washing process, the two wafers were superimposed on each other in an extra pure water with the mirror-finished surfaces of the wafers opposed to each other. Then, the wafers were lifted from the water in their superimposed position. Subsequently, the superimposed wafers were set in a jig having a guide arranged to be located on the periphery of the wafers, and heated to a temperature of 110° C., thereby evaporating a portion of the water captured between the wafers, with the result that the captured water portion was removed and the substrate materials were closely contacted each other. After the removal, when the resulting wafers were observed by using an IR microscope, an ultrasonic microscope, X-ray topography or a like means, as in a normal bonding process, no contact-failure portion was observed in the bonding interface. When the boron concentration in the vicinity of the bonding interface was evaluated, no excessive boron concentration above the level originally contained in the substrate materials, was detected.

Results similar to the above results were obtained when substrate materials comprising each of the above-listed types of combinations (1) to (4) were used.

EXAMPLE 3

A 5-inch Si wafer and another 5-inch Si wafer having a 0.5 μm-thick oxide film formed thereon were subjected to a normal pre-bonding washing process, thereby preparing a pair of substrate materials. Immediately thereafter, the two wafers were immersed in a liquid solution of alcohol, and superimposed on each other in the solution with the mirror-finished surfaces of the wafers opposed to each other. Then, the wafers were lifted from the solution in their superimposed position. Subsequently, the superimposed wafers were heated to a temperature of 100° C., thereby evaporating a portion of the solution captured between the wafers, with the result that the captured solution portion was removed and the substrate materials were closely contacted each other. After the removal, when the resulting wafers were observed by using an IR microscope, an ultrasonic microscope, X-ray topography or a like means, as in a normal bonding process, no contact-failure portion was observed in the bonding interface. When the boron concentration in the vicinity of the bonding interface was evaluated, no excessive boron concentration above the level originally contained in the substrate materials, was detected.

Results similar to the above results were obtained when substrate materials comprising each of the above-listed types of combinations (1) to (4) were used.

EXAMPLE 4

A 5-inch Si wafer and another 5-inch Si wafer having a 0.5 μm-thick oxide film formed thereon were subjected to a normal pre-bonding washing process, thereby preparing a pair of substrate materials. Immediately thereafter, the two wafers were immersed in an aqueous solution of hydrogen peroxide, and superimposed on each other in the solution with the mirror-finished surfaces of the wafers opposed to each other. Then, the wafers were lifted from the solution in their superimposed position. Subsequently, the superimposed wafers were heated to a temperature of 150° C. while the wafers were subjected to a load of 10 kg, thereby evaporating a portion of the solution captured between the wafers, with the result that the captured solution portion was removed and the substrate materials were closely contacted each other. After the removal, when the resulting wafers were observed by using an IR microscope, an ultrasonic microscope, X-ray topography or a like means, as in a normal bonding process, no contact-failure portion was observed in the bonding interface. When the boron concentration in the vicinity of the bonding interface was evaluated, no excessive boron concentration above the level originally contained in the substrate materials, was detected.

Results similar to the above results were obtained when substrate materials comprising each of the above-listed types of combinations (1) to (4) were used.

EXAMPLE 5

A 5-inch Si wafer and another 5-inch Si wafer having a 0.5 μm-thick oxide film formed thereon were subjected to a normal pre-bonding washing process, thereby preparing a pair of substrate materials. Then, the wafers were subjected to a process of imparting a hydrophilic property to the major surfaces of the wafers. Thereafter, the resulting wafers were subjected to a water washing process. In this washing process, the two wafers were superimposed on each other in an extra pure water with the mirror-finished surfaces of the wafers opposed to each other. Then, the wafers were lifted from the water in their superimposed position. Subsequently, the superimposed wafers were heated to a temperature of 180° C., thereby evaporating a portion of the water captured between the wafers, with the result that the captured water portion was removed and the substrate materials were closely contacted each other. After the removal, when the resulting wafers were observed by using an IR microscope, an ultrasonic microscope, X-ray topography or a like means, as in a normal bonding process, no contact-failure portion was observed in the bonding interface. When the boron concentration in the vicinity of the bonding interface was evaluated, no excessive boron concentration above the level originally contained in the substrate materials, was detected.

Results similar to the above results were obtained when substrate materials comprising each of the above-listed types of combinations (1) to (4) were used.

EXAMPLE 6

A 5-inch Si wafer and another 5-inch Si wafer having a 0.5 μm-thick oxide film formed thereon were subjected to a normal pre-bonding washing process, thereby preparing a pair of substrate materials. Thereafter, the wafers were subjected to a water washing process immediately before a wafer drying process. In this washing process, the two wafers were superimposed on each other in an extra pure water with the mirror-finished surfaces of the wafers opposed to each other. Then, the wafers were lifted from the water in their superimposed position. Subsequently, the superimposed wafers were introduced into a vacuum of $10^{-2}$ Torr, thereby drawing out a portion of the water captured between the wafers, with the result that the captured water portion was removed and the substrate materials were closely contacted each other. After the removal, when the resulting wafers were observed by using an IR microscope, an ultrasonic microscope, X-ray topography or a like means, as in a normal bonding process, no contact-failure portion was observed in the bonding interface. When the boron concentration in the vicinity of the bonding interface was evaluated, no excessive boron concentration above the level originally contained in the substrate materials, was detected.

Results similar to the above results were obtained when substrate materials comprising each of the above-listed types of combinations (1) to (4) were used.

EXAMPLE 7

A 5-inch Si wafer and another 5-inch Si wafer having a 0.5 μm-thick oxide film formed thereon were subjected to a normal pre-bonding washing process, thereby preparing a pair of substrate materials. Immediately thereafter, the two wafers were immersed in a liquid solution of alcohol, and superimposed on each other in the solution with the mirror-finished surfaces of the wafers opposed to each other. Then, the wafers were lifted from the solution in their superimposed position. Subsequently, the superimposed wafers were introduced into a vacuum of $10^{-4}$ Torr, thereby drawing out a portion of the solution captured between the wafers, with the result that the captured solution portion was removed and the substrate materials were closely contacted each other. After the removal, when the resulting wafers were observed by using an IR microscope, an ultrasonic microscope, X-ray topography or a like means, as in a normal bonding process, no contact-failure portion was observed in the bonding interface. When the boron concentration in the vicinity of the bonding interface was evaluated, no excessive boron concentration above the level originally contained in the substrate materials, was detected.

Results similar to the above results were obtained when substrate materials comprising each of the above-listed types of combinations (1) to (4) were used.

EXAMPLE 8

A 5-inch Si wafer and another 5-inch Si wafer having a 0.5 μm-thick oxide film formed thereon were subjected to a normal pre-bonding washing process, thereby preparing a pair of substrate materials. Then, the wafers were subjected to a process of imparting a hydrophilic property to the major surfaces of the wafers. Thereafter, the resulting wafers were subjected to a water washing process. In this washing process, the two wafers were superimposed on each other in an extra pure water with the mirror-finished surfaces of the wafers opposed to each other. Then, the wafers were lifted from the water in their superimposed position. Subsequently, the superimposed wafers were introduced into a vacuum of $10^{-6}$ Torr, thereby drawing out a portion of the water captured between the wafers, with the result that the captured water portion was removed and the substrate materials were closely contacted each other. After the removal, when the resulting wafers were observed by using an IR microscope, an ultrasonic microscope, X-ray topography or a like means, as in a normal bonding process, no contact-failure portion was observed in the bonding interface. When the boron concentration in the vicinity of the bonding interface was evaluated, no excessive boron concentration above the level originally contained in the substrate materials, was detected.

Results similar to the above results were obtained when substrate materials comprising each of the above-listed types of combinations (1) to (4) were used.

EXAMPLE 9

A 5-inch Si wafer and another 5-inch Si wafer having a 0.5 μm-thick oxide film formed thereon were subjected to a normal pre-bonding washing process, thereby preparing a pair of substrate materials. Then, the wafers were subjected to a process of imparting a hydrophilic property to the major surfaces of the wafers. Thereafter, the resulting wafers were subjected to a water washing process. In this washing process, the two wafers were superimposed on each other in an extra pure water with the mirror-finished surfaces of the wafers opposed to each other. Then, the wafers were lifted from the water in their superimposed position. Subsequently, the superimposed wafers were set in a jig having a guide arranged to be located on the periphery of the wafers, and introduced into a vacuum of $10^{-8}$ Torr, thereby drawing out a portion of the water captured between the wafers, with the result that the captured water portion was removed and the substrate materials were closely contacted each other. After the removal, when the resulting wafers were observed by using an IR microscope, an ultrasonic microscope, X-ray topography or a like means, as in a normal bonding process, no contact-failure portion was observed in the bonding interface. When the boron concentration in the vicinity of the bonding interface was evaluated, no excessive boron concentration above the level originally contained in the substrate materials, was detected.

Results similar to the above results were obtained when substrate materials comprising each of the above-listed types of combinations (1) to (4) were used.

EXAMPLE 10

A 5-inch Si wafer having four liquid escape grooves formed on a peripheral portion of the major surface thereof along radial vectors on the surface and another 5-inch Si wafer having a non-grooved 0.5 μm-thick oxide film formed thereon, were subjected to a normal pre-bonding washing process, thereby preparing a pair of substrate materials. Thereafter, the wafers were subjected to a water washing process immediately before a wafer drying process. In this washing process, the two wafers were superimposed on each other in an extra pure water with the mirror-finished surfaces of the wafers opposed to each other. Then, the wafers were lifted from the water in their superimposed position. Subsequently, the superimposed wafers were heated to a temperature of 120° C., thereby evaporating a portion of the water captured between the wafers, with the result that the captured water portion was removed and the substrate materials were closely contacted each other. After the removal, when the resulting wafers were observed by using an IR microscope, an ultrasonic microscope, X-ray topography or a like means, as in a normal bonding process, no contact-failure portion was observed in the bonding interface. When the boron concentration in the vicinity of the bonding interface was evaluated, no excessive boron concentration above the level originally contained in the substrate materials, was detected.

Results similar to the above results were obtained when substrate materials comprising each of the above-listed types of combinations (1) to (4) having one or more liquid escape grooves on at least one of the substrate materials were used.

EXAMPLE 11

A 5-inch Si wafer having four liquid escape grooves formed on a peripheral portion of the major surface thereof along radial vectors on the surface and another 5-inch Si wafer having a 0.5 μm-thick oxide film formed thereon with four similar liquid escape grooves formed on the major surface, were subjected to a normal pre-bonding washing process, thereby preparing a pair of substrate materials. Immediately thereafter, the two wafers were immersed in a liquid solution of alcohol, and superimposed on each other in the solution with the mirror-finished surfaces of the wafers opposed to each other. Then, the wafers were lifted from the solution in their superimposed position. Subsequently, the superimposed wafers were heated to a temperature of 90° C., thereby evaporating a portion of the solution captured between the wafers, with the result that the captured solution portion was removed and the substrate materials were closely contacted each other. After the removal, when the resulting wafers were observed by using an IR microscope, an ultrasonic microscope, X-ray topography or a like means, as in a normal bonding process, no contact-failure portion was observed in the bonding interface. When the boron concentration in the vicinity of the bonding interface was evaluated, no excessive boron concentration above the level originally contained in the substrate materials, was detected.

Results similar to the above results were obtained when substrate materials comprising each of the above-listed types of combinations (1) to (4) having one or more liquid escape grooves on at least one of the substrate materials were used.

EXAMPLE 12

A 5-inch Si wafer and another 5-inch Si wafer having a 0.5 μm-thick oxide film formed thereon with four liquid escape grooves formed on a peripheral portion of the major surface along radial vectors on the surface, were subjected to a normal pre-bonding washing process, thereby preparing a pair of substrate materials. Then, the wafers were subjected to a process of imparting a hydrophilic property to the major surfaces of the wafers. Thereafter, the resulting wafers were subjected to a water washing process. In this washing process, the two wafers were superimposed on each other in an extra pure water with the mirror-finished surfaces of the wafers opposed to each other. Then, the wafers were lifted from the water in their superimposed position. Subsequently, the superimposed wafers were heated to a temperature of 200° C., thereby evaporating a portion of the water captured between the wafers, with the result that the captured water portion was removed and the substrate materials were closely contacted each other. After the removal, when the resulting wafers were observed by using an IR microscope, an ultrasonic microscope, X-ray topography or a like means, as in a normal bonding process, no contact-failure portion was observed in the bonding interface. When the boron concentration in the vicinity of the bonding interface was evaluated, no excessive boron concentration above the level originally contained in the substrate materials, was detected.

Results similar to the above results were obtained when substrate materials comprising each of the above-listed types of combinations (1) to (4) having one or more liquid escape grooves on at least one of the substrate materials were used.

EXAMPLE 13

A 5-inch Si wafer and another 5-inch Si wafer having a 0.5 μm-thick oxide film formed thereon with four liquid escape grooves formed on a peripheral portion of the major surface along radial vectors on the surface, were subjected to a normal pre-bonding washing process, thereby preparing a pair of substrate materials. Then, the wafers were subjected to a process of imparting a hydrophilic property to the major surfaces of the wafers. Thereafter, the resulting wafers were subjected to a water washing process. In this washing process, the two wafers were superimposed on each other in an extra pure water with the mirror-finished surfaces of the wafers opposed to each other. Then, the wafers were lifted from the water in their superimposed position. Subsequently, the superimposed wafers were set in a jig having a guide arranged to be located on the periphery of the wafers, and heated to a temperature of 150° C., thereby evaporating a portion of the water captured between the wafers, with the result that the captured water portion was removed and the substrate materials were closely contacted each other. After the removal, when the resulting wafers were observed by using an IR microscope, an ultrasonic microscope, X-ray topography or a like means, as in a normal bonding process, no contact-failure portion was observed in the bonding interface. When the boron concentration in the vicinity of the bonding interface was evaluated, no excessive boron concentration above the level originally contained in the substrate materials, was detected.

Results similar to the above results were obtained when substrate materials comprising each of the above-listed types of combinations (1) to (4) having one or more liquid escape grooves on at least one of the substrate materials were used.

EXAMPLE 14

A 5-inch Si wafer and another 5-inch Si wafer having a 0.5 μm-thick oxide film formed thereon with four liquid escape grooves formed on a peripheral portion of the major surface along radial vectors on the surface, were subjected to a normal pre-bonding washing process, thereby preparing a pair of substrate materials. Thereafter, the wafers were subjected to a water washing process immediately before a wafer drying process. In this washing process, the two wafers were superimposed on each other in an extra pure water with the mirror-finished surfaces of the wafers opposed to each other. Then, the wafers were lifted from the water in their superimposed position. Subsequently, the superimposed wafers were introduced into a vacuum of $10^{-1}$ Torr, thereby drawing out a portion of the water captured between the wafers, with the result that the captured water portion was removed and the substrate materials were closely contacted each other. After the removal, when the resulting wafers were observed by using an IR microscope, an ultrasonic microscope, X-ray topography or a like means, as in a normal bonding process, no contact-failure portion was observed in the bonding interface. When the boron concentration in the vicinity of the bonding interface was evaluated, no excessive boron concentration above the level originally contained in the substrate materials, was detected.

Results similar to the above results were obtained when substrate materials comprising each of the above-listed types of combinations (1) to (4) having one or more liquid escape grooves on at least one of the substrate materials were used.

EXAMPLE 15

A 5-inch Si wafer and another 5-inch Si wafer having a 0.5 μm-thick oxide film formed thereon with four liquid escape grooves formed on a peripheral portion of the major surface along radial vectors on the surface, were subjected to a normal pre-bonding washing process, thereby preparing a pair of substrate materials. Thereafter, the wafers were subjected to a water washing process immediately before a wafer drying process. In this washing process, the two wafers were superimposed on each other in an extra pure water with the mirror-finished surfaces of the wafers opposed to each other. Then, the wafers were lifted from the water in their superimposed position. Subsequently, the superimposed wafers were placed in a vacuum of $10^{-3}$ Torr while the wafers were subjected to a load of 10 kg, thereby drawing out a portion of the water captured between the wafers, with the result that the captured water portion was removed and the substrate materials were closely contacted each other. After the removal, when the resulting wafers were observed by using an IR microscope, an ultrasonic microscope, X-ray topography or a like means, as in a normal bonding process, no contact-failure portion was observed in the bonding interface. When the boron concentration in the vicinity of the bonding interface was evaluated, no excessive boron concentration above the level originally contained in the substrate materials, was detected.

Results similar to the above results were obtained when substrate materials comprising each of the above-listed types of combinations (1) to (4) having one or more liquid escape grooves on at least one of the substrate materials were used.

EXAMPLE 16

A 5-inch Si wafer having four liquid escape grooves formed on a peripheral portion of the major surface thereof along radial vectors on the surface and another 5-inch Si wafer having a 0.5 μm-thick oxide film formed thereon, were subjected to a normal pre-bonding washing process, thereby preparing a pair of substrate materials. Immediately thereafter, the two wafers were immersed in a liquid solution of alcohol, and superimposed on each other in the solution with the mirror-finished surfaces of the wafers opposed to each other. Then, the wafers were lifted from the solution in their superimposed position. Subsequently, the superimposed wafers were introduced into a vacuum of $10^{-5}$ Torr, thereby drawing out a portion of the solution captured between the wafers, with the result that the captured solution portion was removed and the substrate materials were closely contacted each other. After the removal, when the resulting wafers were observed by using an IR microscope, an ultrasonic microscope, X-ray topography or a like means, as in a normal bonding process, no contact-failure portion was observed in the bonding interface. When the boron concentration in the vicinity of the bonding interface was evaluated, no excessive boron concentration above the level originally contained in the substrate materials, was detected.

Results similar to the above results were obtained when substrate materials comprising each of the above-listed types of combinations (1) to (4) having one or more liquid escape grooves on at least one of the substrate materials were used.

EXAMPLE 17

A 5-inch Si wafer having four liquid escape grooves formed on a peripheral portion of the major surface thereof along radial vectors on the surface and another 5-inch Si wafer having a 0.5 µm-thick oxide film formed thereon, were subjected to a normal pre-bonding washing process, thereby preparing a pair of substrate materials. Immediately thereafter, the two wafers were immersed in a liquid solution of alcohol, and superimposed on each other in the solution with the mirror-finished surfaces of the wafers opposed to each other. Then, the wafers were lifted from the solution in their superimposed position. Subsequently, the superimposed wafers were set in a jig having a guide arranged to be located on the periphery of the wafers, and placed in a vacuum of $10^{-7}$ Torr, thereby drawing out a portion of the solution captured between the wafers, with the result that the captured solution portion was removed and the substrate materials were closely contacted each other. After the removal, when the resulting wafers were observed by using an IR microscope, an ultrasonic microscope, X-ray topography or a like means, as in a normal bonding process, no contact-failure portion was observed in the bonding interface. When the boron concentration in the vicinity of the bonding interface was evaluated, no excessive boron concentration above the level originally contained in the substrate materials, was detected.

Results similar to the above results were obtained when substrate materials comprising each of the above-listed types of combinations (1) to (4) having one or more liquid escape grooves on at least one of the substrate materials were used.

EXAMPLE 18

A 5-inch Si wafer having four liquid escape grooves formed on a peripheral portion of the major surface thereof along radial vectors on the surface and another 5-inch Si wafer having a 0.5 µm-thick oxide film formed thereon with four similar liquid escape grooves formed on the major surface, were subjected to a normal pre-bonding washing process, thereby preparing a pair of substrate materials. Then, the wafers were subjected to a process of imparting a hydrophilic property to the major surfaces of the wafers. Thereafter, the resulting wafers were subjected to a water washing process. In this washing process, the two wafers were superimposed on each other in an extra pure water with the mirror-finished surfaces of the wafers opposed to each other. Then, the wafers were lifted from the water in their superimposed position. Subsequently, the superimposed wafers were introduced into a vacuum of $10^{-9}$ Torr, thereby drawing out a portion of the water captured between the wafers, with the result that the captured water portion was removed and the substrate materials were closely contacted each other. After the removal, when the resulting wafers were observed by using an IR microscope, an ultrasonic microscope, X-ray topography or a like means, as in a normal bonding process, no contact-failure portion was observed in the bonding interface. When the boron concentration in the vicinity of the bonding interface was evaluated, no excessive boron concentration above the level originally contained in the substrate materials, was detected.

Results similar to the above results were obtained when substrate materials comprising each of the above-listed types of combinations (1) to (4) having one or more liquid escape grooves on at least one of the substrate materials were used.

EXAMPLE 19

First and second substrate materials were prepared in the following manner:

In order to prepare the first substrate material, a 5-inch (100) single-crystal Si wafer of the P type or N type having a thickness of 625 µm and a resistivity of 0.01 Ω-cm was anodized in an HF solution under the following conditions:

Anodizing Conditions:

Current Density: 5 (mA·cm$^{-2}$)

Anodizing Solution: $HF:H_2O:C_2H_5OH=1:1:1$

Period: 12 min.

Thickness of Porous Si Layer: 10 µm

The resulting wafer was subjected to thermal oxidation in an oxygen atmosphere at 400° C. for 1 hour. The oxidation caused the inner walls of the pores in the porous Si layer to be covered with a thermal oxidation film. Then, on the surface of the porous Si layer, single-crystal Si was grown epitaxially with a thickness of 1 µm by a chemical vapor deposition (CVD) method under the following conditions:

Epitaxial Growth Conditions:

Source Gas: $SiH_2Cl_2/H_2$

Gas Flow Rate: 0.5/180 l/min.

Gas Pressure: 80 Torr

Temperature: 950° C.

Growth Speed: 0.3 µm/min.

Subsequently, on the surface of the resulting epitaxial Si layer, a $SiO_2$ layer having a thickness of 100 nm was formed by thermal oxidation.

In order to prepare the second substrate material, another Si wafer having a 500-nm thermal oxidation film formed thereon was separately prepared.

Thereafter, the wafers were subjected to a normal pre-bonding washing process.

The thus prepared first and second Si substrate materials were subjected to a water washing process immediately before a drying process. In the washing process, the two wafers were superimposed on each other on their major surfaces in the water, and lifted in their superimposed position from the water. Subsequently, the superimposed substrate materials were set in a jig having a guide arranged to be located on the periphery of the substrate materials. The substrate materials were heated to a temperature of 120° C., thereby evaporating a portion of the water captured in the gap between the substrate materials, with the result that the captured water portion was removed and the substrate materials were closely contacted each other. After the removal, when the resulting substrate materials were observed by using an IR microscope, an ultrasonic microscope, X-ray topography or a like means, as in a normal bonding process, no contact-failure portion was observed in the bonding interface.

When a second substrate material comprising a light-transmitting substrate material was used, similar results were obtained.

Similar results were also obtained when a first substrate material having an non-oxidized epitaxial Si surface was used.

Thereafter, the closely contacted first and second substrate materials were subjected to the following process:

The substrate materials were subjected to heat treatment at 1000° C. for 2 hours, thereby bonding together the first and second substrate materials. This heat treatment caused the two substrate materials to be rigidly bonded to each other.

Subsequently, polishing and grinding were performed to remove the first Si substrate material except for its 10 μm-thick inner portion. Thereafter, the remaining 10 μm-thick portion of the first single-crystal Si substrate was selectively etched with an etchant expressed by the following formula while the porous Si layer having pores with thermally-oxidated inner walls served as an etch stop layer:

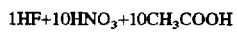

$1HF+10HNO_3+10CH_3COOH$

After 5 minutes, almost all the original first Si substrate material was etched away, thereby exposing the porous Si layer.

Thereafter, the porous Si layer was selectively etched with an etchant comprising a mixture containing a 49-% aqueous solution of hydrofluoric acid and a 30-% aqueous solution of hydrogen peroxide at a mixing ratio of 1:5 while the etchant was stirred. In this process, the single-crystal Si remained unetched, serving as an etch stop material for selectively etching the porous Si layer. After 30 minutes, the porous Si layer was substantially completely etched away.

The above etchant etches non-porous Si single crystals at a very slow etching rate; only 50 Å or less is etched per 30 minutes. This rate has a selective etching ratio of $10^5$ or more with respect to the rate at which the etchant etches a porous Si layer. Thus, the non-porous layer is etched to a depth of several tens of Å, creating a practically negligible reduction in the film thickness.

When a $Si_3N_4$ layer on the reverse surface of the resultant structure was removed, a 1 μm-thick single-crystal Si layer on an insulator was obtained. It was confirmed that the selective etching of the porous Si layer had caused no undesirable change in the single-crystal Si layer.

When a section of the resulting Si layer was observed with a transmission electron microscope, it was confirmed that no crystal defect was newly introduced, and that good crystallinity was maintained.

When the vicinity of the bonding interface was checked, no excessive boron concentration was found, and the level of boron concentration was below the level corresponding to the detection limit.

EXAMPLE 20

A 4-inch gallium arsenic (GaAs) wafer and a 4-inch Si wafer having a 0.5 μm-thick oxide film formed thereon were subjected to a normal pre-bonding washing process, thereby preparing a pair of substrate materials. Thereafter, the wafers were subjected to a water washing process immediately before a drying process. In this washing process, the two wafers were superimposed on each other in an extra pure water with the mirror-finished surfaces of the wafers opposed to each other. Then, the wafers were lifted from the water in their superimposed position. Thereafter, the superimposed wafers were heated to a temperature of 120° C., thereby evaporating a portion of the water captured between the wafers, with the result that the captured water portion was removed and the substrate materials were closely contacted each other. After the removal, when the resulting wafers were observed by using an IR microscope, an ultrasonic microscope, X-ray topography or a like means, as in a normal bonding process, no contact-failure portion was observed in the bonding interface. When the boron concentration in the vicinity of the bonding interface was evaluated, no excessive concentration above the level originally contained in the substrate materials, was detected.

Results similar to the above results were obtained when substrate materials comprising each of the following types of combinations (5) and (6) were used: (5) a GaAs substrate material and a Si substrate material; and (6) a GaAs substrate material and a light-transmitting substrate material.

As has been described above, according to the present invention, it is possible to provide a method for producing a semiconductor substrate and a semiconductor substrate produced by such a method that is capable of overcoming the above-described problems and meeting the above-described requirements.

Superimposing a pair of substrate materials on each other in a boron-free atmosphere (liquid) makes it possible to prevent boron particles from being captured in the bonding interface between substrate materials. This arrangement serves to enable a semiconductor substrate with a controlled impurity concentration to be produced by a bonding process.

Either heating a pair of superimposed substrate materials, which have been superimposed on each other in such a liquid, or introducing the superimposed substrate materials into a vacuum makes it possible to remove a liquid portion captured in the gap between the substrate materials while eliminating the risk that boron particles may again adhere to the substrate materials. This arrangement also serves to enable the production of an impurity-controlled semiconductor substrate by a bonding process.

Thus, the present invention makes it possible to produce an impurity-controlled semiconductor substrate such that the substrate may be used to fabricate SOILSIs.

Using a guide for a pair of superimposed substrate materials and/or loading the superimposed substrate materials makes it possible to prevent displacement of the substrate materials during the process of removing a captured liquid portion.

Preparing a pair of substrate materials such that at least one of the substrate materials has one or more liquid escape grooves formed in a peripheral portion on the surface of the substrate material on which it is to be bonded and extending along radial vectors on that surface, makes it possible to ensure that a captured liquid portion can be readily removed even when, for example, the substrate materials are of a type that can make the removal difficult.

What is claimed is:

1. A method of producing a semiconductor substrate by bonding a pair of substrate materials together, at least one of said substrate materials comprising a semiconductor substrate material, said method comprising the steps of:
   immersing said pair of substrate materials in a liquid;
   superimposing said substrate materials on each other in said liquid;
   lifting said substrate materials in a superimposed position thereof from said liquid; and
   removing a portion of said liquid captured between said substrate materials thereby enabling bonding to be performed so as to bond said substrate materials together without exposing said substrate materials to air.

2. A method according to claim 1, wherein said liquid comprises water substantially free of impurities for cleaning semiconductor materials.

3. A method according to claim 1, further comprising the step of imparting a hydrophilic property to the surfaces of said substrate materials before said substrate materials are immersed in said liquid.

4. A method according to claim 1, further comprising the step of imparting a hydrophobic property to the surfaces of said substrate materials before said substrate materials are immersed in said liquid, and the step of pressurizing said substrate materials after a captured liquid portion has been removed to thereby closely contact said pair of substrate materials.

5. A method according to claim 1, wherein said liquid is removed by sufficient application of heat to evaporate said liquid.

6. A method according to claim 1, wherein said comprises a liquid solution of alcohol.

7. A method according to claim 1, wherein said liquid comprises an aqueous solution of hydrogen peroxide.

8. A method according to claim 1, wherein the captured liquid portion is removed by heating said substrate materials in their superimposed position to thereby evaporate said captured liquid portion.

9. A method according to claim 1, wherein the captured liquid portion is removed by introducing said substrate materials in their superimposed position into a vacuum to thereby draw out said captured liquid portion.

10. A method according to claim 1, wherein the captured liquid portion is removed while said substrate materials in their superimposed position are retained in a jig at least having a guide, or subjected to a load, or subjected to a load while retained in said jig.

11. A method according to claim 1, wherein at least one of said pair of substrate materials has at least one groove formed in a peripheral portion of a major surface of said substrate material, said groove extending along a radius vector on said surface.

12. A method according to claim 1, wherein said liquid has a temperature within a range of from 10° to 80° C.

13. A method according to clam 8, wherein said substrate materials are heated to a temperature within a range of from 50° to 400° C.

14. A method of producing a semiconductor substrate by bonding a pair of substrate materials together, at least one of said substrate materials comprising a semiconductor substrate material having an insulating layer on a surface thereof, said method comprising the steps of:

immersing said pair of substrate materials in a liquid;

superimposing said substrate materials on each other in said liquid;

lifting said substrate materials in a superimposed position thereof from said liquid; and removing a portion of said liquid captured between said substrate materials thereby enabling bonding to be performed so as to bond said substrate materials together without exposing said substrate materials to air.

15. A method according to any one of claims 1 to 12, wherein said substrate materials comprise semiconductor substrate materials.

16. A method according to any one of claims 1 to 12, wherein at least one of said substrate materials comprises a semiconductor substrate material and at least one of said substrate materials comprises a semiconductor substrate material having an oxide film.

17. A method according to any one of claims 1 to 12, wherein said substrate materials comprise semiconductor substrate materials having an oxide films.

18. A method according to any one of claims 1 to 12, wherein at least one of said substrate materials comprises a semiconductor epitaxial substrate material and at least one of said substrate materials comprises a semiconductor substrate material having an oxide film.

19. A method according to any one of claims 1 to 12, wherein at least one of said substrate materials comprises a semiconductor epitaxial substrate material having an oxide film and at least one of said substrate materials comprises a semiconductor substrate material having an oxide film.

20. A method according, to any one of claims 1 to 12, wherein at least one of said substrate materials comprises a semiconductor substrate material and at least one of said substrate materials comprises a light-transmitting substrate material.

21. A method according to any one of claims 1 to 12, wherein at least one of said substrate materials comprises a semiconductor substrate material having an oxide film and at least one of said substrate materials comprises a light-transmitting substrate material.

22. A method according to any one of claims 1 to 12, wherein at least one of said substrate materials comprises a semiconductor epitaxial substrate material and at least one of said substrate materials comprises a light-transmitting substrate material.

23. A method according to any one of claims 1 to 12, wherein at least one of said substrate materials comprises a semiconductor epitaxial substrate material having an oxide film and at least one of said substrate materials comprises a light-transmitting substrate material.

24. A method according to any one of claims 1 to 12, wherein said substrate materials comprise silicon substrate materials.

25. A method according to any one of claims 1 to 12, wherein said substrate materials comprise silicon substrate materials having oxide films.

26. A method according to any one of claims 1 to 12, wherein at least one of said substrate materials comprises a silicon substrate material and at least one of said substrate materials comprises a silicon substrate material having an oxide film.

27. A method according to any one of claims 1 to 12, wherein at least one of said substrate materials comprises a silicon substrate material and at least one of said substrate materials comprises a light-transmitting substrate material.

28. A method according to any one of claims 1 to 12, wherein at least one of said substrate materials comprises a silicon substrate material having an oxide film and at least one of said substrate comprises a light-transmitting substrate material.

29. A method according to any one of claims 1 to 12, wherein at least one of said substrate materials comprises a silicon substrate material and at least one of said substrate materials comprises a GaAs substrate material.

30. A method according to any one of claims 1 to 12, wherein at least one of said substrate materials comprises a silicon substrate material having an oxide film and at least one of said substrate materials comprises a GaAs substrate material.

31. A method according to any one of claims 1 to 12, wherein at least one of said substrate materials comprises a GaAs substrate material having an oxide film and at least one of said substrate materials comprises a light-transmitting substrate material.

32. A method according to claim 1, wherein one of said substrate materials comprises a substrate material having a porous silicon layer, a single crystal silicon layer formed on said porous silicon layer and an oxide film formed on said single-crystal silicon layer.

33. A method according to claim 32, wherein at least one of said substrate materials comprises a silicon substrate material.

34. A method according to claim 33, wherein a further oxide film is formed on a surface of said silicon substrate material.

35. A method according to claim 32, wherein one of said substrate materials is provided by anodizing a part of silicon substrate material to form said porous silicon layer, epitaxially growing said single crystal silicon layer on said porous silicon layer and oxidizing a surface of said single crystal silicon layer form said oxide film.

36. A method according to any one of claims 32 through 35, wherein said liquid comprises water substantially free of impurities for cleaning semiconductor materials.

37. A method according to any one of claims 32 to 35, further comprising the step of heating said substrate materials to be rigidly bonded to each other after removing a portion of said liquid captured between said substrate materials.

38. A method according to claim 37, further comprising the step of removing said porous silicon layer such that said single crystal silicon layer remains on bonded substrate materials after heating said substrate materials.

39. A method according to claim 38, wherein said porous silicon layer is removed by etching.

40. A method according to claim 39, wherein said porous silicon layer is etched with an etching comprising a aqueous solution including hydrofluoric acid.

* * * * *

UNITED STATES PATENT AND TRADEMARK OFFICE
CERTIFICATE OF CORRECTION

PATENT NO. : 5,763,288

DATED : June 9, 1998

INVENTOR(S) : KIYOFUMI SAKAGUCHI, ET AL.          Page 1 of 2

It is certified that error appears in the above-identified patent and that said Letters Patent is hereby corrected as shown below:

COLUMN 3

Line 20, "depicts" should read --depict--; and
    Line 34, "depicts" should read --depict--.

COLUMN 5

Line 38, "a" should read --at a--;
    Line 45, "counterbore, shown" should read
        --counterbore (shown--;
    Line 47, "pins, shown" should read --pins (shown--; and
    Line 50, "9A)" should read --9A--.

COLUMN 8

Line 13, "mirorr-finished" should read --mirror-finished--.

COLUMN 17

Line 14, "thermally-oxidated" should read
        --thermally oxidized--.

COLUMN 19

Line 14, "said" should read --said liquid--;
    Line 15, "liquid" should be deleted;
    Line 38, "clam" should read --claim--; and
    Line 67, "films." should read --film.--.

UNITED STATES PATENT AND TRADEMARK OFFICE
CERTIFICATE OF CORRECTION

PATENT NO. : 5,763,288

DATED : June 9, 1998

INVENTOR(S) : KIYOFUMI SAKAGUCHI, ET AL.          Page 2 of 2

It is certified that error appears in the above-identified patent and that said Letters Patent is hereby corrected as shown below:

COLUMN 20

Line 11, "according," should read --according--; and
    Line 49, "said substrate" should read
        --said substrate materials--.

COLUMN 21

Line 14, "form" should read --to form--.

COLUMN 22

Line 14, "etching" should read --etchant-- and
    "a" should read --an--.

Signed and Sealed this

Thirtieth Day of March, 1999

Attest:

Attesting Officer

Q. TODD DICKINSON

Acting Commissioner of Patents and Trademarks